(12) United States Patent
Qu et al.

(10) Patent No.: US 12,538,667 B2
(45) Date of Patent: Jan. 27, 2026

(54) DISPLAY SUBSTRATE, MANUFACTURING METHOD THEREOF AND DISPLAY DEVICE

(71) Applicant: BOE Technology Group Co., Ltd., Beijing (CN)

(72) Inventors: Caiyu Qu, Beijing (CN); Huijuan Zhang, Beijing (CN); Zunqing Song, Beijing (CN); Dengyun Chen, Beijing (CN); Yibing Fan, Beijing (CN); Liangjian Li, Beijing (CN); Zheng Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 526 days.

(21) Appl. No.: 17/624,724

(22) PCT Filed: Apr. 6, 2021

(86) PCT No.: PCT/CN2021/085542
§ 371 (c)(1),
(2) Date: Jan. 4, 2022

(87) PCT Pub. No.: WO2021/204100
PCT Pub. Date: Oct. 14, 2021

(65) Prior Publication Data
US 2022/0254865 A1    Aug. 11, 2022

(30) Foreign Application Priority Data
Apr. 9, 2020    (CN) .......................... 202010274294.2

(51) Int. Cl.
*H10K 59/131*    (2023.01)
*H10K 59/12*    (2023.01)
(Continued)

(52) U.S. Cl.
CPC ....... *H10K 59/131* (2023.02); *H10K 59/1315* (2023.02); *H10K 59/1201* (2023.02);
(Continued)

(58) Field of Classification Search
CPC .. H10K 59/1315; H10K 71/00; H10K 77/111; H10K 59/1201; H10K 59/121;
(Continued)

(56) References Cited

U.S. PATENT DOCUMENTS 7,952,123 B2 *    5/2011    Gotoh ................. H01L 29/4908
                                                                  438/149
8,790,973 B2 *    7/2014    Scheiper ......... H01L 21/823842
                                                                  438/275
(Continued)

FOREIGN PATENT DOCUMENTS

CN        105140199 A        12/2015
CN        105514116 A         4/2016
(Continued)

OTHER PUBLICATIONS

Preparation, structure and properties of titanium-boron-carbon-nitride hard film.
(Continued)

*Primary Examiner* — Eduardo A Rodela
(74) *Attorney, Agent, or Firm* — IPro, PLLC

(57) ABSTRACT

The present disclosure provides a display substrate, a manufacturing method thereof and a display device, and relates to the field of display technology. The display substrate includes a base substrate, and a driving circuitry layer and a light-emitting unit arranged on the base substrate. The driving circuitry layer includes a first gate metal layer, and a pattern of the first gate metal layer includes a gate line. The first gate metal layer includes a first conductive layer with resistivity less than a first threshold and a Young's modulus
(Continued)

less than a second threshold, and a first conductive protection layer arranged at a side of the first conductive layer away from the base substrate.

9 Claims, 1 Drawing Sheet

(51) Int. Cl.
    *H10K 71/40*     (2023.01)
    *H10K 77/10*     (2023.01)
    *H10K 102/00*     (2023.01)

(52) U.S. Cl.
    CPC .......... *H10K 71/441* (2023.02); *H10K 77/111* (2023.02); *H10K 2102/311* (2023.02)

(58) Field of Classification Search
    CPC .......... H10K 59/1213; H10K 59/1216; H10K 59/131; H01L 29/495; H01L 29/4958; H01L 29/4966
See application file for complete search history.

(56) References Cited

U.S. PATENT DOCUMENTS

| | | | | |
|---|---|---|---|---|
| 9,466,668 | B2* | 10/2016 | Colinge | H01L 29/7843 |
| 9,646,829 | B2* | 5/2017 | Ohno | H01L 21/02631 |
| 10,256,256 | B2* | 4/2019 | Park | H01L 27/1233 |
| 11,600,793 | B2* | 3/2023 | Han | C08G 73/1039 |
| 2015/0362776 | A1 | 12/2015 | Jikumaru et al. | |
| 2018/0145118 | A1* | 5/2018 | Kim | H10K 59/50 |
| 2018/0248032 | A1 | 8/2018 | Zhou | |
| 2019/0006450 | A1* | 1/2019 | Lee | H01L 29/4908 |
| 2019/0348481 | A1 | 11/2019 | Yanagisawa et al. | |
| 2020/0124910 | A1* | 4/2020 | Hwang | G02F 1/136209 |
| 2021/0098555 | A1* | 4/2021 | Kim | H10K 59/121 |
| 2021/0335938 | A1 | 10/2021 | Huang et al. | |
| 2022/0028963 | A1* | 1/2022 | Lee | H01L 27/1251 |
| 2022/0190264 | A1* | 6/2022 | Yun | H10K 50/80 |

FOREIGN PATENT DOCUMENTS

| | | |
|---|---|---|
| CN | 109686742 A | 4/2019 |
| CN | 110176482 A | 8/2019 |
| CN | 110610967 A | 12/2019 |
| CN | 110828514 A | 2/2020 |
| CN | 111463244 A | 7/2020 |
| JP | 2016027374 A | 2/2016 |

OTHER PUBLICATIONS

CN 202010274294.2 second office action.
PCT/CN2021/085542 international search report and written opinion.

* cited by examiner

DISPLAY SUBSTRATE, MANUFACTURING METHOD THEREOF AND DISPLAY DEVICE

CROSS-REFERENCE TO RELATED APPLICATION

This application is the U.S. national phase of PCT application No. PCT/CN2021/085542 filed on Apr. 6, 2021, which claims a priority of the Chinese patent application No. 202010274294.2 filed on Apr. 9, 2020, the entire contents of which are incorporated herein by reference.

TECHNICAL FIELD

The present disclosure relates to the field of display technology, in particularly to a display substrate, a manufacturing method thereof and a display device.

BACKGROUND

In the related art, display unevenness occurs for medium-size and large-size display products. To be specific, a length of a gate line increases along with an increase in a screen size. Due to resistance of the gate line, a scanning signal is delayed and there is no enough time for turning on gate electrodes of some pixels, resulting in a poor display effect and uneven brightness.

SUMMARY

The present disclosure provides the following technical solutions.

In one aspect, the present disclosure provides in some embodiments a display substrate, including a base substrate, and a driving circuitry layer and a light-emitting unit arranged on the base substrate. The driving circuitry layer includes a first gate metal layer, and a pattern of the first gate metal layer includes a gate line. The first gate metal layer includes a first conductive layer with resistivity less than a first threshold and a Young's modulus less than a second threshold, and a first conductive protection layer arranged at a side of the first conductive layer away from the base substrate.

In a possible embodiment of the present disclosure, the first threshold is 5 micro-ohm·centimeter ($\mu\Omega\cdot cm$), and the second threshold is 130 Gpa.

In a possible embodiment of the present disclosure, the first conductive layer is Aluminium (Al) or an Al alloy.

In a possible embodiment of the present disclosure, the Al alloy includes at least one of Cerium (Ce), Zirconium (Zr), Scandium (Sc), Manganese (Mn), Nickel (Ni), and Lanthanum (La).

In a possible embodiment of the present disclosure, the first gate metal layer further includes a second conductive protection layer arranged at a side of the first conductive layer close to the base substrate.

In a possible embodiment of the present disclosure, the first conductive protection layer is made of Titanium Nitride (TiN), and the second conductive protection layer is made of TiN.

In a possible embodiment of the present disclosure, a thickness of the first conductive layer is 300 nm-500 nm, a thickness of the first conductive protection layer is 30 nm-50 nm, and a thickness of the second conductive protection layer is 30 nm-50 nm.

In a possible embodiment of the present disclosure, the driving circuitry layer further includes a second gate metal layer arranged at a side of the first gate metal layer away from the base substrate, a pattern of the second gate metal layer includes an electrode plate of a storage capacitor, and a structure of the second gate metal layer is the same as a structure of the first gate metal layer.

In another aspect, the present disclosure provides in some embodiments a display device including the above-mentioned display substrate.

In yet another aspect, the present disclosure provides in some embodiments a method for manufacturing a display substrate, including forming a driving circuitry layer and a light-emitting unit on a base substrate. The driving circuitry layer includes a first gate metal layer, and a pattern of the first gate metal layer includes a gate line. Forming the first gate metal layer includes forming a first conductive layer with resistivity less than a first threshold and a Young's modulus less than a second threshold, and forming a first conductive protection layer arranged at a side of the first conductive layer away from the base substrate.

In a possible embodiment of the present disclosure, prior to forming the first gate metal layer, the method further includes: providing a rigid substrate and forming a flexible substrate on the rigid substrate; forming a buffer layer on the flexible substrate; forming an active layer on the buffer layer; and forming a first gate insulation layer.

In a possible embodiment of the present disclosure, the first gate metal layer further includes a second conductive protection layer arranged at a side of the first conductive layer close to a flexible substrate. The method further includes: depositing TiN on the flexible substrate to form the second conductive protection layer; depositing Al or an Al alloy on the second conductive protection layer to form the first conductive layer; and depositing TiN on the first conductive layer to form the first conductive protection layer.

In a possible embodiment of the present disclosure, subsequent to forming the first gate metal layer, the method further includes forming a second gate insulation layer, and forming a second gate metal layer with a same structure as the first gate metal layer.

In a possible embodiment of the present disclosure, the method further includes depositing an interlayer insulation layer through Plasma Enhanced Chemical Vapor Deposition (PECVD). The interlayer insulation layer is made of silicon nitride or silicon oxide, or has a double-layer structure including a silicon nitride thin film and a silicon oxide thin film.

In a possible embodiment of the present disclosure, the method further includes depositing a source/drain metal layer, and patterning the source/drain metal layer to form a pattern of the source/drain metal layer.

In a possible embodiment of the present disclosure, the forming the light-emitting unit includes: depositing a transparent conductive layer, and patterning the transparent conductive layer to form an anode pattern; forming a pixel definition layer through exposing and developing an organic resin; forming a light-emitting layer and a cathode through evaporation; and forming a packaging layer.

Figure 1:
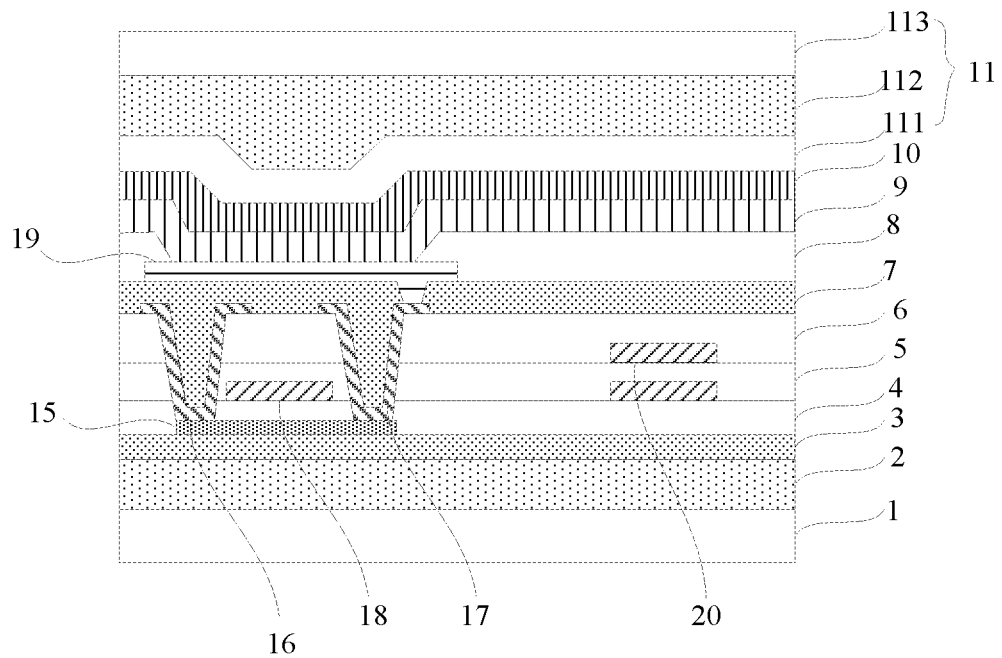
FIG. 1 is a schematic view showing a display substrate according to one embodiment of the present disclosure.

REFERENCE SIGN LIST 1 rigid substrate
2 flexible substrate 3 buffer layer
4 first gate insulation layer
5 second gate insulation layer
6 interlayer insulation layer
7 planarization layer
8 pixel definition layer
9 light-emitting layer
10 cathode
11 packaging layer
111 first inorganic thin film
112 second organic thin film
113 third inorganic thin film
15 active layer
16 source electrode
17 drain electrode
18 first gate metal layer
181 first conductive layer
182 first conductive protection layer
183 second conductive protection layer
19 anode
20 second gate metal layer

DETAILED DESCRIPTION

In order to make the objects, the technical solutions and the advantages of the present disclosure more apparent, the present disclosure will be described hereinafter in a clear and complete manner in conjunction with the drawings and embodiments.

In Active-Matrix Organic Light-Emitting Diode (AMOLED) display, display unevenness, e.g., cyan in the middle of a screen and purple at two lateral edges of the screen, occurs for medium-size and large-size products when an image is displayed. To be specific, a length of a gate line increases along with an increase in a screen size. Due to resistance of the gate line, a scanning signal is delayed and there is no enough time for turning on gate electrodes of some pixels, resulting in a poor display effect and uneven brightness. In addition, due to a large bending radius of an existing foldable display product, it is impossible to fully meet user's requirements.

An object of the present disclosure is to provide a display substrate, a manufacturing method thereof and a display device, so as to improve a display effect of the display device.

The present disclosure provides in some embodiments a display substrate, which includes a base substrate, and a driving circuitry layer and a light-emitting unit arranged on the base substrate. The driving circuitry layer includes a first gate metal layer, and a pattern of the first gate metal layer includes a gate line. At least a part of the first gate metal layer includes a first conductive layer with resistivity less than a first threshold and a Young's modulus less than a second threshold.

In the embodiments of the present disclosure, the first gate metal layer is made of the first conductive layer with resistivity less than the first threshold, so as to improve conductive performance of the first gate metal layer, and reduce resistance of the gate line itself, thereby to shorten a delay time of a scanning signal and improve a display effect. In addition, the Young's modulus of the first conductive layer is less than the second threshold, so as to improve bending resistance of the first gate metal layer, and when the display substrate is applied to a foldable display product, it is able to provide a smaller bending radius, thereby to improve a folding effect of the foldable display product.

In the embodiments of the present disclosure, the first threshold is 5 micro-ohm·centimeter (μΩ·cm), so as to provide the gate line with low resistance and shorten the delay time of the scanning signal, thereby to improve the display effect of the display substrate.

In the embodiments of the present disclosure, the second threshold is 130 Gpa, so as to improve the bending resistance of the first gate metal layer.

In the embodiments of the present disclosure, the first conductive layer is Al or an Al alloy, so as to provide good conductivity and a low Young's modulus. The Al alloy includes at least one of Ce, Zr, Sc, Mn, Ni, and La. In the related art, a gate metal layer is made of Molybdenum (Mo), and resistivity of Mo is up to 17.6μΩ·cm. In the case that the first conductive layer is made of Al, the resistivity of the first conductive layer is 4.2μΩ·cm, which is far less than the resistivity of Mo, so it is able to provide good conductivity.

In a possible embodiment of the present disclosure, the display substrate may be an Organic Light-Emitting Diode (OLED) display substrate. As shown in FIG. 1, the OLED display substrate includes: a flexible substrate 2 made of a polyimide thin film with a thickness of about 10 μm; a buffer layer 3 on the flexible substrate 2, the buffer layer 3 being made of silicon nitride or silicon oxide, or having a double-layer structure including a silicon nitride thin film and a silicon oxide thin film, a thickness of the silicon nitride thin film being 50 nm-300 nm, and a thickness of the silicon oxide thin film being 100 nm-300 nm; an active layer 15 on the buffer layer 3, the active layer 15 being made of polysilicon, and a thickness of the active layer 15 being 40 nm-50 nm; a first gate insulation layer 4 arranged at a side of the active layer 15 away from the flexible substrate 2, the first gate insulation layer 4 being made of silicon nitride or silicon oxide, or having a double-layer structure including a silicon nitride thin film and a silicon oxide thin film, a thickness of the silicon nitride thin film being 100 nm-500 nm, and a thickness of the silicon oxide thin film being 400 nm-1000 nm; a pattern of the first gate metal layer 18 on the first gate insulation layer 4, including a gate electrode, a gate line, and an electrode plate of a storage capacitor; a second gate insulation layer 5 arranged at a side of the first gate metal layer 18 away from the flexible substrate 2, the second gate insulation layer 5 being made of silicon nitride or silicon oxide, e.g., a silicon nitride thin film with a thickness of 100 nm-150 nm; a pattern of a second gate metal layer 20 on the second gate insulation layer 5, the pattern of the second gate metal layer 20 including an electrode plate of the storage capacitor and forming the storage capacitor together with the pattern of the first gate metal layer 18 or the other film layer pattern; an interlayer insulation layer 6 arranged at a side of the second gate metal layer 20 away from the flexible substrate 2, the interlayer insulation layer 6 being made of silicon nitride or silicon oxide, or having a double-layer structure including a silicon nitride thin film and a silicon oxide thin film, a thickness of the silicon nitride thin film being 200 nm-300 nm, and a thickness of the silicon oxide thin film being 150 nm-200 nm; a pattern of a source/drain metal layer on the interlayer insulation layer 6, the pattern of the source/drain metal layer including a source electrode 16 and a drain electrode 17; a planarization layer 7 at a side of the pattern of the source/drain metal layer away from the flexible substrate 2; an anode 19 on the planarization layer 7, the anode 19 being coupled to the drain electrode 17 through a via hole penetrating through the planarization layer 7; a pixel definition layer 8 at a side of the anode 19 away from the flexible substrate 2, the pixel definition layer 8 defining a plurality of pixel regions; a light-emitting layer 9 at a side of the anode 19 away from the flexible substrate 2; a cathode 10 at a side of the light-emitting layer 9 away from the flexible substrate 2; and a packaging layer 11 at a side of the cathode 10 away from the flexible substrate 2, the packaging layer 11 including a first inorganic thin film 111, a second organic thin film 112 and a third inorganic thin film 113 laminated one on another.

Figure 2:
FIG. 2 to FIG. 4 are schematic views showing a first gate metal layer according to one embodiment of the present disclosure.

As shown FIG. 2, the first gate metal layer 18 may merely include the first conductive layer 181, that is, the first gate metal layer 18 is merely made of Al or the Al alloy, so as to provide a simple structure and a simple manufacturing process, thereby to reduce the manufacture cost of the display substrate. A thickness of the first conductive layer 181 is 300 nm-500 nm.

Figure 3:

In the embodiments of the present disclosure, as shown in FIG. 3, in addition to the first conductive layer 181, the first gate metal layer 18 further includes a first conductive protection layer 182 arranged at a side of the first conductive layer 181 away from the flexible substrate 2. After the formation of the pattern of the first gate metal layer 18, the display substrate is subjected to a high-temperature process, and hillock easily occurs on a surface of Al or the Al alloy. Through the first conductive protection layer 182, it is able to prevent the occurrence of hillock for the first conductive layer 181 in the high-temperature process, and protect the first conductive layer 181 from being damaged by an etching solution in a subsequent process. To be specific, the first conductive protection layer 182 is made of TiN, and a thickness of the first conductive protection layer 182 is 30 nm-50 nm.

Figure 4:

With the development of a display substrate process, in the embodiments of the present disclosure, the pattern of the first gate metal layer 18 may also be in contact with the active layer. In order to avoid co-dissolution when the pattern of the first gate metal layer 18 is in contact with silicon in the active layer, as shown in FIG. 4, the pattern of the first gate metal layer 18 further includes a second conductive protection layer 183 at a side of the first conductive layer 181 close to the flexible substrate 2. To be specific, the second conductive protection layer 183 is made of TiN, and a thickness of the second conductive protection layer 183 is 30 nm-50 nm.

In the embodiments of the present disclosure, a structure of the second gate metal layer 20 is the same as a structure of the first gate metal layer 18, which will thus not be particularly defined herein.

The present disclosure further provides in some embodiments a display device, which includes the above-mentioned display substrate.

The display device includes, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device may be any product or member having a display function, such as a television, a display, a digital photo frame, a mobile phone and a tablet computer. The display device further includes a flexible circuit board, a printed circuit board and a back plate.

The present disclosure further provides in some embodiments a method for manufacturing a display substrate, which includes forming a driving circuitry layer and a light-emitting unit on a base substrate. The driving circuitry layer includes a first gate metal layer, and a pattern of the first gate metal layer includes a gate line. Forming the first gate metal layer includes: forming a first conductive layer with resistivity less than a first threshold and a Young's modulus less than a second threshold; and forming a first conductive protection layer arranged at a side of the first conductive layer away from the base substrate.

In the embodiments the present disclosure, the first gate metal layer is made of the first conductive layer with resistivity less than the first threshold, so as to improve conductive performance of the first gate metal layer, and reduce resistance of the gate line, thereby to shorten a delay time of a scanning signal and improve a display effect. In addition, the Young's modulus of the first conductive layer is less than the second threshold, so as to improve bending resistance of the first gate metal layer, and when the display substrate is applied to a foldable display product, it is able to provide a smaller bending radius, thereby to improve a folding effect of the foldable display product.

In a possible embodiment of the present disclosure, as shown in FIG. 1, the method includes the following steps.

Step 1: providing a rigid substrate 1 and forming a flexible substrate 2 on the rigid substrate 1.

The rigid substrate 1 is a glass substrate or a quartz substrate. In the case that the rigid substrate is a glass substrate, the glass substrate is cleaned. Then a double-layer polyimide (PI) film is coated on the glass substrate, and cured at 300° C.-400° C. to form a PI thin film with a thickness of about 10 μm as the flexible substrate 2.

Step 2: forming a buffer layer 3 on the flexible substrate 2.

To be specific, the buffer layer 3 is deposited through PECVD. The buffer layer 3 is made of silicon nitride or silicon oxide, or has a double-layer structure including a silicon nitride thin film and a silicon oxide thin film. In the case that the buffer layer 3 has the double-layer structure including the silicon nitride thin film and the silicon oxide thin film, a silicon nitride layer with a thickness of 50 nm-300 nm is deposited prior to a silicon dioxide layer with a thickness of 100 nm-300 nm.

Step 3: forming an active layer 15 on the buffer layer 3.

To be specific, an amorphous silicon layer with a thickness of 40 nm-50 nm is deposited on the buffer layer 3, and heated for 0.5 to 3 hours at 400° C., and then subjected to Excimer Laser Annealing (ELA) treatment to form a polysilicon layer. Then, the polysilicon layer is patterned to form the active layer 15. The active layer 15 may be subjected to ion doping.

Step 4: forming a first gate insulation layer 4.

To be specific, the first gate insulation layer 4 is deposited through PECVD. The first gate insulation layer 4 is made of silicon nitride or silicon oxide, or has a double-layer structure including a silicon nitride thin film and a silicon oxide thin film. In the case that the first gate insulation layer 4 has the double-layer structure including the silicon nitride thin film and the silicon oxide thin film, a silicon oxide layer with a thickness of 400 nm-1000 nm is deposited prior to a silicon nitride layer with a thickness of 100 nm-500 nm.

Step 5: forming a pattern of a first gate insulation layer 18.

In a possible embodiment of the present disclosure, as shown in FIG. 2, the first gate metal layer 18 may merely include a first conductive layer 181, so as to provide a simple structure and a simple manufacturing process, thereby to reduce the manufacture cost of the display substrate. In the case that the first gate metal layer 18 merely includes the first conductive layer 181, a layer of Al or an Al alloy is deposited through plasma sputtering to form the first conductive layer 181, and then the first conductive layer 181 is patterned to form the pattern of the first gate metal layer 18.

In another possible embodiment of the present disclosure, as shown in FIG. 3, in addition to the first conductive layer 181, the first gate metal layer 18 further includes a first conductive protection layer 182 arranged at a side of the first conductive layer 181 away from the flexible substrate 2. In the case that the first gate metal layer 18 includes the first conductive layer 181 and the first conductive protection layer 182, a layer of Al or the Al alloy is deposited to form the first conductive layer 181, and a layer of TiN is deposited to form the first conductive protection layer 182. The first conductive protection layer 182 and the first conductive layer 181 are patterned to form the pattern of the first gate metal layer 18. Through the first conductive protection layer 182, it is able to prevent the occurrence of hillock for the first conductive layer 181 in a high-temperature process and protect the first conductive layer 181 from being damaged by an etching solution in a subsequent process.

In yet another possible embodiment of the present disclosure, as shown in FIG. 4, the pattern of the first gate metal layer 18 further includes a second conductive protection layer 183 at a side of the first conductive layer 181 close to the flexible substrate 2. In the case that the first gate metal layer 18 includes the second conductive protection layer 183, the first conductive layer 181 and the first conductive protection layer 182, a layer of TiN is deposited to form the second conductive protection layer 183, a layer of Al or the Al alloy is deposited to form the first conductive layer 181, and a layer of TiN is deposited to form the first conductive protection layer 182. The second conductive protection layer 183, the first conductive layer 181 and the first conductive protection layer 182 are patterned to form the pattern of the first gate metal layer 18. Through the second conductive protection layer 183, it is able to prevent co-dissolution when the pattern of the first gate metal layer 18 is in contact with silicon in the active layer.

Step 6: forming a second gate insulation layer 5.

To be specific, the second gate insulation layer 5 is deposited through PECVD, and it is made of silicon nitride with a thickness of 100 nm-150 nm.

Step 7: forming a pattern of a second gate metal layer 20.

A structure of the second gate metal layer 20 is the same as a structure of the first gate metal layer 18, and a process of forming the pattern of the second gate metal layer 20 may refer to Step 5, which will thus not be particularly defined herein.

Step 8: forming a pattern of an interlayer insulation layer 6.

The interlayer insulation layer 6 is deposited through PECVD. The interlayer insulation layer is made of silicon nitride or silicon oxide, or has a double-layer structure including a silicon nitride thin film and a silicon oxide thin film. In the case that the interlayer insulation layer 6 has the double-layer structure including the silicon nitride thin film and the silicon oxide thin film, a silicon oxide layer with a thickness of 150 nm-200 nm is deposited prior to a silicon nitride layer with a thickness of 200 nm-300 nm. During the patterning, the interlayer insulation layer 6 may be etched in a one-step manner or a multi-step manner.

Step 9: forming a pattern of a source/drain metal layer.

To be specific, the source/drain metal layer with a thickness of about 2000 A-4000 A is deposited on the substrate obtained in Step 8 through magnetron sputtering, thermal evaporation or any other film forming methods. The source/drain metal layer is made of Cuprum (Cu), Al, Argentum (Ag), Mo, Chromium (Cr), Neodymium (Nd), Ni, Mn, Ti, Tantalum (Ta) or Tungsten (W), or an alloy thereof. The source/drain metal layer may be a single-layer structure or a multi-layer structure such as Cu\Mo, Ti\Cu\Ti or Mo\Al\Mo. The source/drain metal layer is patterned to form the pattern of the source/drain metal layer, and the pattern of the source/drain metal layer includes a source electrode 16 and a drain electrode 17.

Step 10: forming a planarization layer 7.

The planarization layer 7 is made of an organic resin with a thickness of 1 μm-2 μm, and the organic resin may be Benzocyclobutene (BCB) or any other organic photosensitive materials.

Step 11: forming an anode 19.

To be specific, a transparent conductive layer with a thickness of about 300 A-1500 A is deposited on the substrate obtained in Step 10 through sputtering or thermal evaporation. The transparent conductive layer may be made of Indium Tin Oxide (ITO), Indium Zinc Oxide (IZO) or any other transparent metal oxides. The transparent conductive layer is patterned to form the pattern of the anode 19.

Step 12: forming a pattern of a pixel definition layer 8.

To be specific, a layer of an organic resin with a thickness of about 4000 Å-30000 Å is coated on the substrate obtained in Step 11, and the organic resin may be BCB or any other organic photosensitive materials. After exposure and development, the pattern of the pixel definition layer 8 is formed.

Step 13: forming a light-emitting layer 9 and a cathode 10.

To be specific, the light-emitting layer 9 and the cathode 10 are formed through evaporation.

Step 14: forming a packaging layer 11.

To be specific, the packaging layer 11 includes a first inorganic thin film 111, a second organic thin film 112 and a third inorganic thin film 113 laminated one on another.

The display substrate in the embodiments of the present disclosure may be obtained through the above steps, and then the flexible substrate 2 may be peeled off from the rigid substrate 1 to obtain a flexible and bendable display substrate.

In the embodiments the present disclosure, the first gate metal layer is made of the first conductive layer with resistivity less than the first threshold, so as to improve conductive performance of the first gate metal layer, and reduce resistance of the gate line, thereby to shorten a delay time of a scanning signal and improve a display effect. In addition, the Young's modulus of the first conductive layer is less than the second threshold, so as to improve bending resistance of the first gate metal layer, and when the display substrate is applied to a foldable display product, it is able to provide a smaller bending radius, thereby to improve a folding effect of the foldable display product.

In the embodiments of the present disclosure, the order of the steps is not limited to the serial numbers thereof. For a person skilled in the art, any change in the order of the steps shall also fall within the scope of the present disclosure if without any creative effort.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a base substrate, and a driving circuitry layer and a light-emitting unit arranged on the base substrate, wherein the driving circuitry layer comprises a first gate metal layer, and a pattern of the first gate metal layer comprises a gate line, the first gate metal layer comprises a first conductive layer with resistivity less than a first threshold and a Young's modulus less than a second threshold, and a first conductive protection layer arranged at a side of the first conductive layer away from the base substrate;
    wherein the first threshold is 5 micro-ohm·centimeter ($\mu\Omega\cdot cm$), and the second threshold is 130 Gpa;
    wherein the first conductive layer is Aluminium (Al);
    wherein the first gate metal layer further comprises a second conductive protection layer arranged at a side of the first conductive layer close to the base substrate, the first conductive protection layer is made of Titanium Nitride (TiN), and the second conductive protection layer is made of TiN;
    wherein a thickness of the first conductive layer is 300 nm-500 nm, a thickness of the first conductive protection layer is 30 nm-50 nm, and a thickness of the second conductive protection layer is 30 nm-50 nm.

2. The display substrate according to claim 1, wherein the first conductive layer is an Al alloy, and the Al alloy comprises at least one of Cerium (Ce), Zirconium (Zr), scandium (Sc), Manganese (Mn), Nickel (Ni), and Lanthanum (La).

3. A display device, comprising the display substrate according to claim 1.

4. The display substrate according to claim 1, wherein the driving circuitry layer further comprises a second gate metal layer arranged at a side of the first gate metal layer away from the base substrate, a pattern of the second gate metal layer comprises an electrode plate of a storage capacitor, and a composition of the second gate metal layer is the same as a composition of the first gate metal layer.

5. A method for manufacturing a display substrate, comprising forming a driving circuitry layer and a light-emitting unit on a base substrate, wherein the driving circuitry layer comprises a first gate metal layer, and a pattern of the first gate metal layer comprises a gate line, wherein forming the first gate metal layer comprises forming a first conductive layer with resistivity less than a first threshold and a Young's modulus less than a second threshold, and forming a first conductive protection layer arranged at a side of the first conductive layer away from the base substrate;
    wherein the first threshold is 5 micro-ohm·centimeter ($\mu\Omega\cdot cm$), and the second threshold is 130 Gpa;
    wherein the first gate metal layer further comprises a second conductive protection layer arranged at a side of the first conductive layer close to a flexible substrate, wherein the method further comprises: depositing TiN on the flexible substrate to form the second conductive protection layer; depositing Al or an Al alloy on the second conductive protection layer to form the first conductive layer; and depositing TiN on the first conductive layer to form the first conductive protection layer;
    wherein a thickness of the first conductive layer is 300 nm-500 nm, a thickness of the first conductive protection layer is 30 nm-50 nm, and a thickness of the second conductive protection layer is 30 nm-50 nm.

6. The method according to claim 5, wherein prior to forming the first gate metal layer, the method further comprises: providing a rigid substrate and forming a flexible substrate on the rigid substrate; forming a buffer layer on the flexible substrate; forming an active layer on the buffer layer; and forming a first gate insulation layer.

7. The method according to claim 5, further comprising depositing an interlayer insulation layer through Plasma Enhanced Chemical Vapor Deposition (PECVD), wherein the interlayer insulation layer is made of silicon nitride or silicon oxide, or has a double-layer structure comprising a silicon nitride thin film and a silicon oxide thin film.

8. The method according to claim 7, further comprising depositing a source/drain metal layer, and patterning the source/drain metal layer to form a pattern of the source/drain metal layer.

9. The method according to claim 8, wherein the forming the light-emitting unit comprises: depositing a transparent conductive layer, and patterning the transparent conductive layer to form an anode pattern; forming a pixel definition layer through exposing and developing an organic resin; forming a light-emitting layer and a cathode through evaporation; and forming a packaging layer.

* * * * *